(12) United States Patent
Barrenscheen

(10) Patent No.: US 7,688,241 B2
(45) Date of Patent: Mar. 30, 2010

(54) METHOD AND APPARATUS FOR DETECTING AN ANALOGUE SIGNAL USING A SELECTION CIRCUIT

(75) Inventor: Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/840,245

(22) Filed: Aug. 17, 2007

(65) Prior Publication Data

US 2008/0042887 A1 Feb. 21, 2008

(30) Foreign Application Priority Data

Aug. 17, 2006 (DE) ........................ 10 2006 038 409

(51) Int. Cl.
*H03M 1/00* (2006.01)
(52) U.S. Cl. .................. 341/132; 341/141; 341/142; 341/155; 341/161
(58) Field of Classification Search ................. 341/141, 341/142, 155, 132, 161
See application file for complete search history.

(56) References Cited

U.S. PATENT DOCUMENTS

| | | | | |
|---|---|---|---|---|
| 4,050,062 A | * | 9/1977 | Crocker et al. | ............... 341/141 |
| 5,081,454 A | | 1/1992 | Campbell, Jr. et al. | |
| 5,166,685 A | | 11/1992 | Campbell, Jr. et al. | |
| 5,248,971 A | * | 9/1993 | Mandl | ......................... 341/141 |
| 5,559,994 A | * | 9/1996 | Ando | ......................... 711/167 |
| 6,522,983 B1 | * | 2/2003 | Dobos et al. | .................. 702/89 |
| 6,577,348 B1 | * | 6/2003 | Park | ............................. 348/554 |
| 6,788,230 B2 | * | 9/2004 | Ahn | ............................. 341/131 |
| 6,836,230 B2 | * | 12/2004 | Le Pailleur et al. | ......... 341/141 |
| 7,030,791 B2 | * | 4/2006 | Harada | ....................... 341/118 |
| 7,126,515 B1 | * | 10/2006 | Kris | ............................ 341/141 |
| 7,212,143 B1 | * | 5/2007 | Confalonieri | ............... 341/155 |
| 7,292,170 B2 | * | 11/2007 | Kinyua et al. | ............... 341/141 |
| 7,315,265 B2 | * | 1/2008 | Wiley et al. | ................. 341/100 |
| 7,432,836 B2 | * | 10/2008 | Games | ....................... 341/116 |
| 2004/0182992 A1 | * | 9/2004 | Aibara et al. | ........... 250/214 A |

FOREIGN PATENT DOCUMENTS

DE 19936329 A1 3/2001

\* cited by examiner

*Primary Examiner*—Linh V Nguyen

(57) ABSTRACT

A selection circuit is used for detecting analogue signals from different inputs. For the detection of a signal switched through by means of the selection circuit, a delay time during the detection of the switched-through signal is set depending on the occurrence of a setting operation in the selection circuit. The selection circuit can have a plurality of switches each having an assigned delay time and the detection can be controlled in such a way that it does not take place until after the elapsing of the delay times of all the involved in switching through the analogue signal to be detected.

12 Claims, 3 Drawing Sheets

METHOD AND APPARATUS FOR DETECTING AN ANALOGUE SIGNAL USING A SELECTION CIRCUIT

RELATED APPLICATION

The present application claims priority to German Application No. 10 2006 038 409 filed Aug. 17, 2006, which is incorporated by reference herein in its entirety.

FIELD OF THE INVENTION

This invention relates generally to the detection of an analogue signal using a selection circuit connected upstream, in particular to a method and a system for analogue-to-digital conversion when using a selection circuit for selection from a set of a plurality of analogue signals.

BACKGROUND

During the detection of analogue signals, it is also possible for a plurality of different analogue signals to be detected when using a selection circuit with a single detection device. For this purpose, the analogue signals to be detected are selected by means of the selection circuit and switched through to the detection device, which then detects them. The signal paths lead from the sources of the different analogue signals through the selection circuit to the detection device. These signal paths can have specific time responses, such that the analogue signal propagates from the source to the detection device only with a limited speed. In order to take account of the limited propagation speed, a delay time can be inserted prior to each analogue signal detection.

The signal paths from different analogue signal sources can be different in this case, such that different delay times can be set depending on the signal path set.

SUMMARY OF THE INVENTION

An analogue-to-digital conversion system comprises a detection device, which has an analogue signal input, and a control device for controlling a selection circuit. The selection circuit is for coupling to the signal input of the detection device and is not necessarily part of the analogue-to-digital conversion system. The control device is configured to set a delay time prior to the detection of an analogue signal present at the signal input of the detection device depending on the occurrence of a setting operation of the selection circuit.

DETAILED DESCRIPTION

Figure 1:
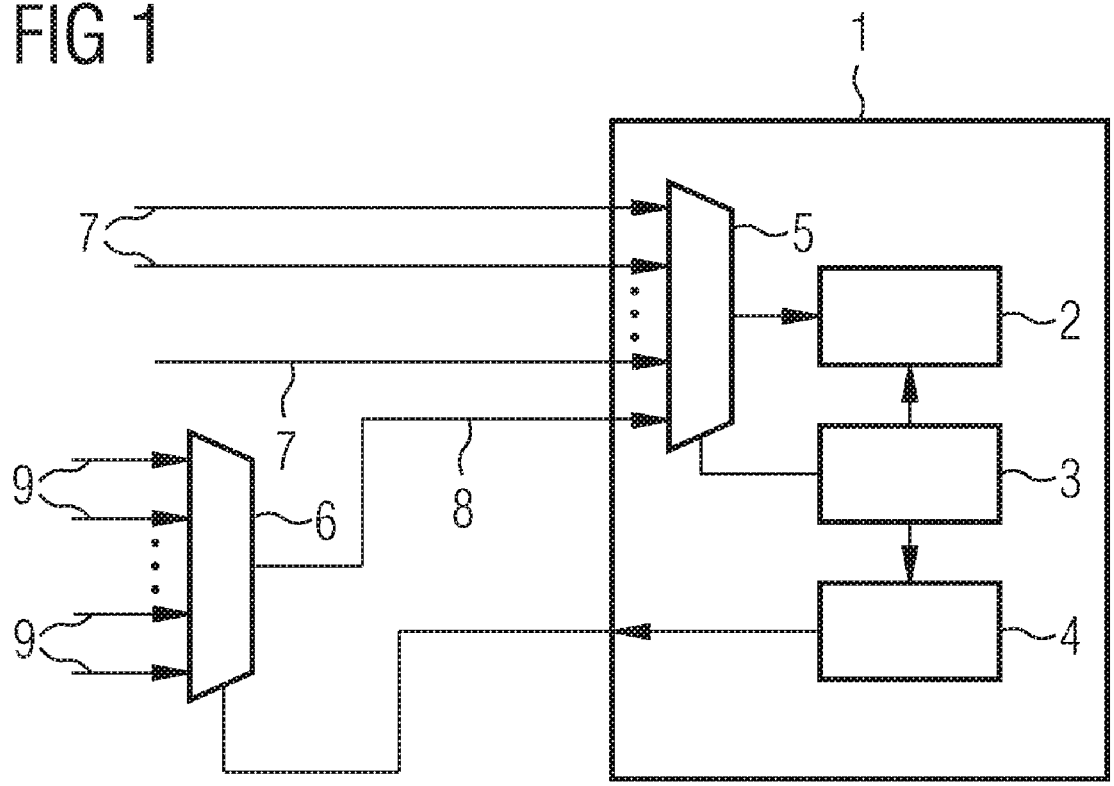
FIG. 1 shows a first exemplary embodiment of a system for analogue signal detection.

FIG. 1 shows an analogue signal detection system 1. In the present example, the system 1 is a microcontroller having a program-controlled data processing device. The microcontroller 1 serves for detecting a plurality of analogue signals that can be applied via analogue lines 7, 9. In this case, the analogue lines 7 are connected directly to a selection switch 5 within the microcontroller 1. The selection switch 5 can be a multiplexer and is set up for selecting one from a specific number of analogue input signals and forwarding it to a detection device 2 connected downstream of the selection switch 5. The inputs of the selection switch 5 are connected to terminals of the microcontroller 1. All or only a portion of the inputs of the multiplexer 5 can be routed towards the outside, i.e. be connected to terminals of the microcontroller 1. These terminals are usually called I/O terminals and their number can vary depending on the variant of the microcontroller 1.

The microcontroller 1 is connected to an external selection switch 6, which, in this exemplary embodiment, is a multiplexer and serves as an extension multiplexer. The output of the multiplexer 6 is connected to an input 8 of the internal multiplexer 5 of the microcontroller 1. Consequently, the analogue signal lines 7 are connected directly to the microcontroller 1 and thus to the internal multiplexer 5, and the analogue signal lines 9 are connected to the microcontroller 1 via the external multiplexer 6. The internal multiplexer 5 forms together with the external multiplexer 6 a selection circuit by means of which one from the analogue signal lines 7, 9 can be selected and switched through to the output of the internal multiplexer 5.

The microcontroller 1 furthermore has a detection device 2 for detecting an analogue signal at the output of the internal multiplexer 5. In the present exemplary embodiment, the detection device 2 comprises an analogue-to-digital converter, ADC for short. The ADC can be any of the known converter types. The detection device 2 is generally set up in such a way that it can measure an analogue signal present. For this purpose, the detection device 2 can have an analogue storage element that stores the analogue signal present at a specific instant. The stored analogue signal can be kept constant over a specific time duration in order that the ADC has enough time for the conversion. In addition, the analogue signal present at a specific instant can also be charged into a storage element, from which the contained charge is subsequently taken during the ADC conversion in order to determine the charge contained in the storage element and thus the stored analogue signal. When using a flash converter, which can convert an analogue signal present without the need for buffer storage in a very short time, it is also possible to dispense with an analogue storage element.

Buffer storage of the analogue signal supplied by the internal multiplexer 5 can be carried out by means of a sample/hold element. The sample/hold element can be formed from a capacitance as storage element together with an analogue switch connected upstream thereof. When the analogue switch is closed, the capacitance is charged with the voltage of the selected analogue signal and follows it. This operation is also referred to as sample operation. As soon as the voltage is intended to be stored at a specific instant, the analogue switch is opened, such that the capacitance retains the voltage value stored last. In this case, the capacitance and the analogue switch can be contained as an associated block in the detection device 2 or else in the multiplexer 5.

In the case of the system illustrated in FIG. 1, the microcontroller 1 additionally has a channel controller 3, which controls the internal multiplexer 5 and the detection device 2.

Figure 4:
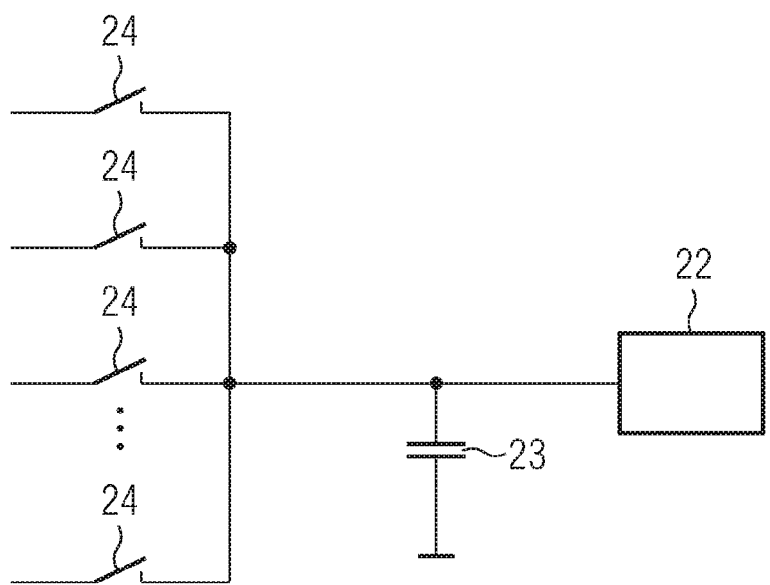
FIG. 4 shows an exemplary embodiment of a selection circuit for use in an analogue signal detection system.

FIG. 4 shows a configuration with a sample/hold element which can be used in all the exemplary embodiments described. The configuration comprises a capacitance 23 as analogue storage element, which is connected by one end to a fixed voltage potential, here earth/ground, and by the other end to the analogue line carrying the analogue signal to be detected. Said analogue line is connected to a plurality of analogue switches 24, which form a selection switch. For this purpose, the analogue switches 24 are driven in such a way that at most one of them is closed. The terminals of the switches 24 which are not connected to the capacitance 23 form the analogue signal inputs, from which an analogue signal can be selected, and thus the inputs of the selection switch formed by the switches 24. The analogue signal line connected to the capacitance 23 is furthermore connected to a detection device 22, which can quantize a voltage signal stored in the capacitance 23.

The switches 24 form together with the capacitance 23 a combination of a multiplexer and a sample/hold element. For this purpose, in the sample phase, the switch 24 connected to the analogue line whose voltage is intended to be detected is closed. After a time that suffices for charging the capacitance 23 to the voltage to be detected, the switch 24 is opened, such that all of the switches 24 are open. In this hold phase, the voltage of the capacitance 23 is not influenced by an analogue input signal any more and is therefore maintained over a specific time duration. This presupposes that the detection device 22 draws no or only a very small current from the capacitance 23 and has preferably a high input resistance. The detection device 22 can be any desired analogue-to-digital converter. In one particular embodiment, the capacitance 23 together with the detection device 22 can form the analogue-to-digital converter by virtue of the fact that the charge contained in the capacitance 23 is recharged into further capacitances in the detection device 22 in a controlled manner. Given knowledge of the capacitance 23 and the capacitances in the detection device 22, the voltage contained in the capacitance 23 at the beginning of the recharging operation can be determined in this way.

The switches 24 can have a specific resistance, which can also be different for the various switches 24. The resistance of a switch 24 forms together with the capacitance 23 a low-pass filter in such a case. Additional resistances can be connected in series upstream or downstream of individual or all resistances 24 in order to increase the total resistance and thus to increase the time constant and hence the low-pass filter effect of the low-pass filter formed together with the capacitance 23.

In principle, in all the embodiments a low-pass filter can be inserted in the signal path of the analogue signal to be detected and the functioning can be set in such a way that during the detection by the detection device 2, 22, a capacitance 23 arranged upstream of the detection device 2, 22 remains connected to the signal source switched through by the selection circuit. For this purpose, the respective switch 24 can remain closed. In this case, the time constant of the low-pass filter can be chosen to be large in comparison with the detection speed of the detection device 2, 22, such that the maximum possible change in the voltage across the capacitance 23 during a detection by the detection device 2, 22 does not lead to an impermissible error during the detection.

In this exemplary embodiment, the internal multiplexer 5 has eight inputs led out from the microcontroller 1. Of these eight inputs, seven inputs 7 are led out from the system and serve for connection to analogue signal sources to be detected. One input 8 of the internal multiplexer 5 is connected to the output of an external multiplexer 6. The external multiplexer 6 serves within the system for extending the number of analogue input lines and itself has further inputs 8. In this exemplary embodiment, the external multiplexer also has eight inputs 9. The external multiplexer 6 is furthermore connected to an external multiplexer controller 4, which is in turn connected to the channel controller 3. The external multiplexer controller 4 selects a specific input of the multiplexer 6 depending on signals received from the channel controller 3. The signal input 9 selected by multiplexer 6 is then conducted to the signal input 8 of the internal multiplexer 5. If an analogue signal 9 present at the external multiplexer 6 is intended to be converted, the internal multiplexer 5 must correspondingly also switch the input 8 through to the detection device 2. The channel controller 3 ensures by direct driving of the internal multiplexer 5 and also by the driving of the external multiplexer 6 by means of the external multiplexer controller 4 that the analogue input 7, 9 that is correspondingly to be detected is switched through to the detection device 2.

In this case, the signal path for the analogue inputs 9 differs from the signal path of the analogue inputs 7. The analogue inputs 9 also pass through the external multiplexer 6 in addition to the internal multiplexer 5, which external multiplexer can represent an additional resistance. This means that it can take different lengths of time before a voltage present at the inputs 7, 9, after switching through to the detection device 2, has propagated to that point. The consequence of this is that the voltage present at the input of the detection device 2 corresponds with sufficient accuracy to the voltage present at the analogue input 7, 9 only after times possibly having different lengths. In order to take this into account, the channel controller 3 sets a sample time, for which there is a wait prior to each conversion, depending on the setting operation of the multiplexers 5, 6.

Figure 5:
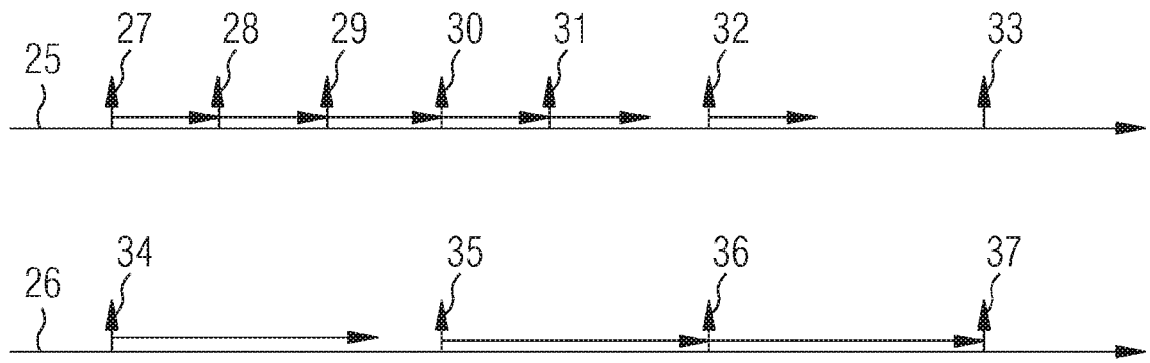
FIG. 5 shows the temporal progression of the analogue signal detection in an analogue signal detection system.

FIG. 5 shows timing diagrams for the control of the two multiplexers 5, 6 and also the detection device 2. In this case the upper time scale 25 shows setting operations 27 to 33 of the internal multiplexer 5 and the lower time scale 26 shows setting operations 34 to 37 of the external multiplexer 6. Each setting operation 27 to 37 represents the setting of the respective multiplexer 5, 6 with an arrow directed upwards. The renewed setting to the same input as before can also be regarded as a setting operation, even if no alteration of the setting occurs. In principle, in all the embodiments it is possible to take account of whether a switch-over and hence an alteration of the setting occurs during a setting operation, and in such a case to set a shorter or else no delay time at all prior to the detection. An unnecessary delay time is thus avoided since it is not necessary to wait until the end of a transient process.

The arrows directed towards the right which issue from each setting operation 27 to 37 in each case represent a preset wait time for which it is necessary to wait after each setting operation 27 to 37 before a new detection of the analogue signal can take place. The microcontroller 1 is set up in such a way that there is a wait for a first, shorter time duration after each setting operation of the internal multiplexer 5 and there is a wait for a second, longer time duration after each setting operation of the external multiplexer 6, as can be seen in FIG. 5. This can be achieved by means of two counters or generally with the aid of two timers which provide for a predetermined time delay. For this purpose, each counter, for example, can be loaded with a predetermined value at the start, that is to say upon each setting operation 27 to 37 of a multiplexer 5, 6. The counters are counted down with a specific clock timing and, once they have reached zero or some other fixed value, output a signal and indicate the elapsing of the delay time in that way. As an alternative, the counters can be loaded with zero at the start and be counted up or down, the counter readings being compared with threshold values and the elapsing of the respective time duration being indicated when the threshold values are reached.

In this case, the delay times after each switching operation 27 to 33 of the internal multiplexer 5 are significantly shorter than the time durations after each switching operation 34 to 37 of the external multiplexer 6. The reason for this choice of the respective delay times resides in the different signal path for the analogue signals that are switched via the external multiplexer 6. On account of the additional external multiplexer 6, the signal needs a longer time to settle, such that it is necessary to wait for a longer time prior to a correct detection. This time can be set and can be made dependent on the time response of the signal path. If, by way of example, the input 8 of the internal multiplexer 5 is buffered with a capacitance, the latter, after a setting operation of the external multiplexer 6, must first be charged to the voltage potential newly switched through, which can mean an additional delay during the transient process.

A sequence of different analogue signal detections is described below with the aid of the time progression illustrated in FIG. 5. At the beginning, the internal multiplexer 5 is set by means of the setting operation 27 and the external multiplexer 6 is set simultaneously by means of the setting operation 34. At this instant, two delay times to be complied with start to proceed, which delay times are different for the two multiplexers 5, 6, however, as illustrated. In this case the internal multiplexer 5 is set to one of the signal inputs 7 which is not switched via the external multiplexer 6. At the instant of the setting operation 28, a detection can be effected by means of the detection device 2 since the delay time of the preceding setting operation 27 has elapsed and an input 7 of the internal multiplexer 5 which is not switched via the external multiplexer 6 is intended to be detected and, consequently, it is also not necessary to comply with the delay time to be complied with after the setting operation of the external multiplexer 6. By means of the setting operation 28, the internal multiplexer 5 is set to another input 7, such that a conversion of an input 7 can be effected once again at the instant of the succeeding setting operation 29.

By means of the setting operation 29, the internal multiplexer 5 is switched to the input 8 in order to detect the voltage at the input 9 which was set by means of the setting operation 34 at the external multiplexer 6. A condition for this, however, is that both delay times which were started after the setting operations 29, 34 of both multiplexers 5, 6 have elapsed. This is the case at the instant of the setting operations 30, 35, with the result that the voltage at the selected input 9 can be detected at this instant. The setting operation 30 sets the internal multiplexer 5 to a signal input 7 again and the setting operation 35 sets the external multiplexer to another input 9. Since the internal multiplexer 5 is set to an input 7 which is not switched via the external multiplexer 6, it is necessary to wait only for the shorter delay time that was started by the setting operation 30. Consequently, the next detection can be effected at the instant of the setting operation 31.

By means of the setting operation 31, the internal multiplexer 5 is set to the input 8 again in order to detect the signal input 9 set previously in the setting operation 35. In this case it is necessary again to wait for the elapsing of both delay times. The shorter delay time for the internal multiplexer 5 on account of the setting operation 31 then elapses before the elapsing of the delay time for the external multiplexer 6 on account of the setting operation 35, with the result that it is necessary to wait for the elapsing of the delay time on account of the setting operation 35. This is the case at the instant of the setting operations 32, 36. The signal input 9 set by means of the setting operation 35 at the external multiplexer 6 is then detected. By means of the setting operation 32, the internal multiplexer 5 is switched to the input 8 and, by means of the setting operation 36, the external multiplexer 6 is switched to another input 9 in order to convert a signal at the external multiplexer 6 at the next possible instant. For this purpose, it is necessary again to wait for the elapsing of both delay times that were started by the setting operations 32 and 36. This is the case at the instant of the setting operations 33, 37.

Generally it holds true that when converting a signal input 7 connected to the internal multiplexer 5 without being switched via an additional external multiplexer 6, it is necessary to wait only for the delay time that was started by a setting operation 27 to 33 of the internal multiplexer 5. Only if an input 9 of the external multiplexer 6 is intended to be detected is it necessary to wait both for the elapsing of the delay time started by a setting operation 27 to 33 of the internal multiplexer 5 and for the elapsing of a delay time started by a setting operation 34 to 37 of the external multiplexer 6.

The advantage of two delay times which elapse independently of one another and which are in each case started by the setting operation of the internal multiplexer 5 or by a setting operation of the external multiplexer 6 consists in the fact that after a setting operation 34 to 37 of the external multiplexer 6, the internal multiplexer 5 can be switched over for the conversion of a signal at the input 7 without the delay time for external multiplexer 6 having to start to proceed from the beginning. After the conversion of a signal at an input 7 of the internal multiplexer 5, the latter can be switched over again to the input 8 in order to convert the signal at the input 9 to which the external multiplexer 6 was set previously.

In the detection operations illustrated in FIG. 5, the setting operations 27 to 33 of the internal multiplexer always coincide temporally with the setting operations 34 to 37 of the external multiplexer 6. This need not necessarily be the case. Thus, it is possible, for example, for a setting operation 34 to 37 of the external multiplexer 6 to occur during the elapsing of a delay time started by a setting operation 27 to 33 for the internal multiplexer 5. As a result, during the preparation for a detection of a signal at an input 7 of the internal multiplexer 5, the external multiplexer 6 can already be set in order to be able to convert an input 9 of the external multiplexer 6 as rapidly as possible, particularly if the latter has a longer delay time. It is equally conceivable for the internal multiplexer 5 to be set to the input 8 and the external multiplexer 6 to be set to an input 9 in order to convert a signal at an input 9 of the external multiplexer 6 and then afterwards to set the internal multiplexer 5 to an input 7 again in order to detect a signal present there. As a result, it is possible for example to use the elapsing of the comparative long delay times after a setting operation of the external multiplexer 6 for the conversion of another signal at an input 7. A trigger for this may be for example the reception of a request with higher priority for the conversion of a signal at an input 7.

Figure 2:
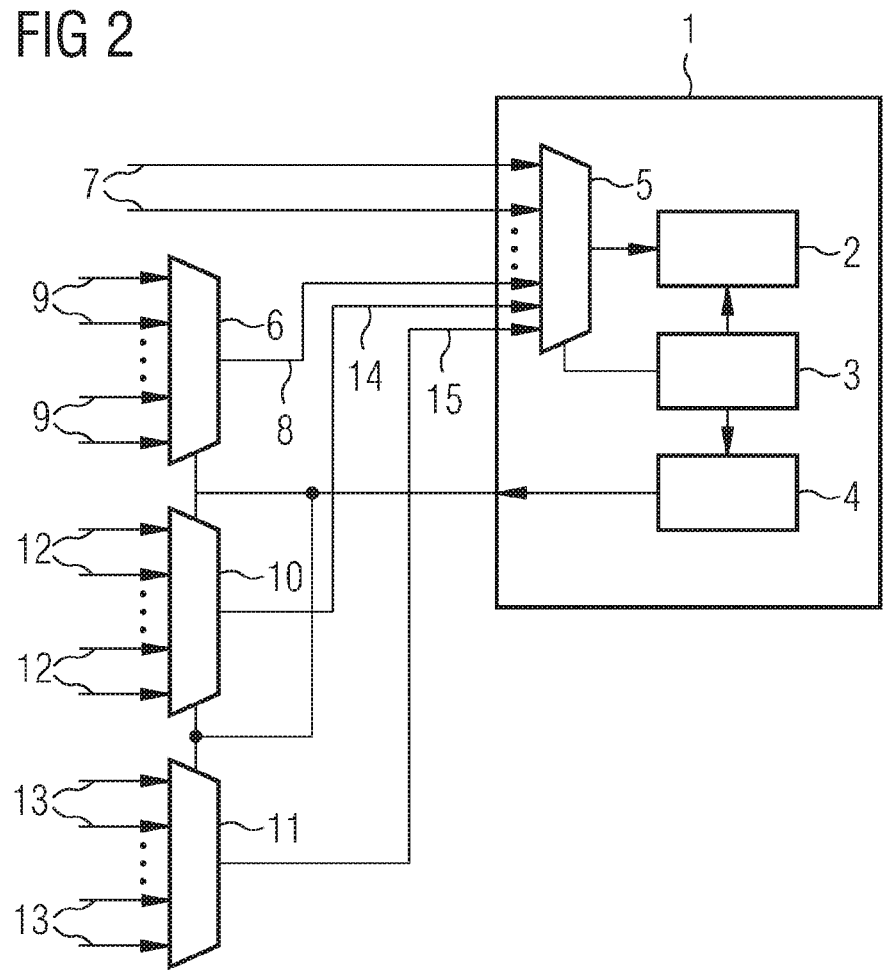
FIG. 2 shows a second exemplary embodiment of a system for analogue signal detection.

FIG. 2 illustrates a further exemplary embodiment of a system for analogue-to-digital conversion. The system illustrated is comparable to the system illustrated in FIG. 1 and likewise has a microcontroller 1 and, contained therein, a detection device 2, a channel controller 3, an external multiplexer controller 4 and an internal multiplexer 5. The essential difference with respect to the system illustrated in FIG. 1 consists in the fact that a plurality of external multiplexers or extension multiplexers 6, 10, 11 are provided. In this case, each external multiplexer 6, 10, 11 is coupled to a separate input 8, 14, 15 of the internal multiplexer 5. This means that of the eight inputs of the internal multiplexer 5, three inputs 8, 14, 15 are connected to an external multiplexer 6, 10, 11 and accordingly only five inputs 7 remain to which an analogue signal can be applied without interposition of an external multiplexer 6, 10, 11. The control inputs of the external multiplexers 6, 10, 11 are connected in parallel and connected to the external multiplexer controller 4. Consequently, all the external multiplexers 6, 10, 11 are driven in parallel and in each case set to the same channel. In this case, the first external multiplexer 6 has the inputs 9, the external multiplexer 10 has the inputs 12, and the external multiplexer 11 has the inputs 13. Consequently, a total of 24 inputs 9, 12, 13 are available at the external multiplexers 6, 10, 11 on the basis of an eight-to-one multiplexer in each case. For selection of the correct input 9, 12, 13, the internal multiplexer 5 selects the input 8, 14, 15 which is connected to the external multiplexer 6, 10, 11 at whose input 9, 12, 13 the signal to be detected is present.

Here, too, as in the case of the system in FIG. 1, a first delay time is started during each setting operation of the internal multiplexer 5 and a second delay time is started during a setting operation of the external multiplexers 6, 10, 11, the second delay time of the external multiplexers 6, 10, 11 being longer than the first delay time of the internal multiplexer 5. The way in which analogue signals at the inputs 7, 9, 12, 13 are detected by means of the system in accordance with FIG. 2 is the same as that described with reference to the system according to FIG. 1 and the sequence according to FIG. 5. The only difference is in the behaviour of the channel controller 3, which, upon selection of an input 9, 12, 13 at an external multiplexer 6, 10, 11, does not always have to switch to the same input of the internal multiplexer 5, but rather to one of the three inputs 8, 14, 15 of the internal multiplexer 5, in accordance with the external multiplexer 6, 10, 11 at which the signal to be converted is present.

Figure 3:
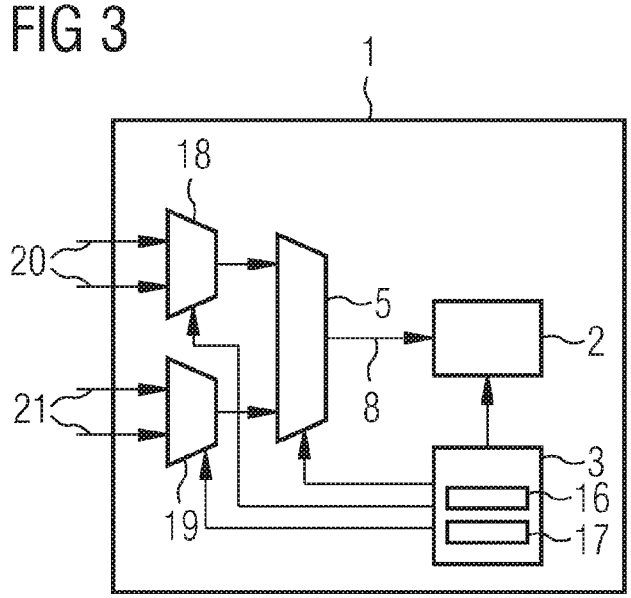
FIG. 3 shows a third exemplary embodiment of a system for analogue signal detection.

A further exemplary embodiment of a system for analogue-to-digital conversion is described in FIG. 3. This system, in the same way as the systems described above, has a selection circuit having cascaded selection switches or multiplexers which together form a selection circuit. The system in FIG. 3 is realized completely in a semiconductor, in this case a microcontroller 1. The microcontroller 1 has internally a detection device 2, a channel controller 3, a multiplexer 5, which can also be called a main multiplexer, and also two extension multiplexers 18, 19. The outputs of the extension multiplexers 18, 19 are connected to inputs of the multiplexer 5, the output of which is connected to the input of the detection device 2. Each multiplexer 5, 18, 19 has two inputs, such that a total of four inputs are available as a result of the cascading, the input lines 20 being connected to the first extension multiplexer 18 and the inputs 21 being connected to the second extension multiplexer 19. All three multiplexers 5, 18, 19 are controlled by the channel controller 3 by means of separate control lines.

For this purpose, the channel controller 3 has two counters 16, 17, by means of which the elapsing of a specific time duration can be monitored. In this case, the first counter 16 serves for monitoring the elapsing of a first time duration and the second counter 17 serves for monitoring the elapsing of a second time duration. Both counters 16, 17 are set up in such a way that they can be started independently of one another in the case of a specific event and output a signal after the elapsing of the respective time duration. In this case, the first counter 16 is assigned to the first extension multiplexer 18, such that the counter 16 is started upon each setting operation of the first extension multiplexer 18. In the same way, the second counter 17 is assigned to the second extension multiplexer 19, such that the counter 17 is started upon each setting operation of the second multiplexer 19.

The time delays of the two counters 16, 17 are chosen in such a way that they permit the two second multiplexers 18, 19, after a switch-over operation, to settle to the value that was switched through. In this case, the two time durations of the two counters 16, 17 can be coordinated with the respective second extension multiplexer 18, 19 if these have different time responses. Furthermore, in the case of the time delays of the two counters 16, 17, it is also possible to take account of the temporal behaviour of the signal path between the respective extension multiplexer 18, 19 and the corresponding input of the first multiplexer 5. Thus, an amplifier, for example an operational amplifier, can be coupled for example between the extension multiplexer 18 or the extension multiplexer 19 or both and the corresponding input of the multiplexer 5. In this case, the time delays of the two counters 16, 17 can be lengthened in order to enable the amplifier, too, to settle. In principle, the delay time set in a counter 16, 17 can be set in accordance with the temporal behaviour of the complete signal path starting from the input of the respectively assigned extension multiplexer 18, 19 as far as the input of the multiplexer 5.

The first counter 16 is started upon each setting operation of the first extension multiplexer 18 and the second counter 17 is started upon each setting operation of the second extension multiplexer 19. The detection of the signal present at the output of the multiplexer 5 is carried out only if that one of the two counters 16, 17 which is assigned to the extension multiplexer 18, 19 via which the signal to be detected is switched has come to an end. If, by way of example, a signal is detected at an input 20 and at the same time the second extension multiplexer 19 is already set to the input 21 to be detected next, then the delay time in the counter 17 already starts to elapse while the signal at an input 20 is still being detected. If in a next detection operation the multiplexer 5 is switched over in order to switch through the output of the second extension multiplexer 19, and the counter 17 has already come to an end at this instant, the detection of the signal at the switched-through input 21 can be started without further delay.

In the exemplary embodiment illustrated in FIG. 3, in one development, the channel controller 3 can be provided with a third counter assigned to the multiplexer 5. The third counter can likewise indicate the elapsing of a time delay and is started upon each setting operation of the multiplexer 5. In this case, a detection would be performed by the detection device 2 only if the time delays of all the multiplexers 5, 18, 19 through which the signal to be detected next passes had elapsed.

All the systems for analogue-to-digital conversion of the exemplary embodiments described above can be integrated partly or completely in a semiconductor component. This can be a microcontroller, for example.

In all the exemplary embodiments described it is also possible to use only one delay element, which can be started with different delay times. In this case, the delay element is started with a first, small value during a setting operation of the internal multiplexer or of the main multiplexer 5 and is started with a second, larger value during a setting operation of an external multiplexer or extension multiplexer 6, 10, 11, 18, 19.

In all the exemplary embodiments described, the delay times can be applied to every setting operation, in principle, or else only to specific setting operations in which, for example, a switch-over occurs or in which specific orders of specific setting operations occur.

Furthermore, in all the exemplary embodiments, it may be provided as a further alternative that the delay time is intended to elapse prior to an additional sample time instead of the sample time being concomitantly integrated into the delay time.

The invention claimed is:

1. Method for detecting an analogue signal by means of a detection device, which has an analogue signal input, and a selection circuit coupled to the signal input of the detection device, the method comprising the steps of:
determining the occurrence of a setting operation of the selection circuit, and
setting a delay time prior to the detection of an analogue signal present at the signal input of the detection device depending on the occurrence of a setting operation of the selection circuit, wherein the delay time is increased after the occurrence of a setting operation of the selection circuit.

2. Method according to claim 1, wherein the selection circuit comprises a main selection switch and a preselection switch connected in series, the main selection switch is connected between the preselection switch and the detection device and the delay time is set depending on the occurrence of a setting operation of the preselection switch.

3. Method according to claim 2, further comprising starting an auxiliary delay time with the occurrence of a setting operation of the preselection switch and wherein the delay time for a detection elapses at the earliest with the elapsing of the auxiliary delay time if, during the detection, a signal present at the preselection switch is switched to the signal input of the detection device.

4. Method according to claim 1, wherein the elapsing of the delay time is determined by a settable delay element and the delay element is set depending on the occurrence of a setting operation of the selection circuit.

5. Method according to claim 1, wherein the delay time is set by a control device, which also controls the selection circuit.

6. Analogue-to-digital conversion system comprising a detection device, which has an analogue signal input, and a control device for controlling a selection circuit for coupling to the signal input of the detection device, wherein the control device is configured to determine an occurrence of a setting operation of the selection circuit and to set a delay time prior to the detection of an analogue signal present at the signal input of the detection device depending on the occurrence of a setting operation of the selection circuit, wherein the delay time is increased after the occurrence of a setting operation of the selection circuit.

7. Analogue-to-digital conversion system according to claim 6, wherein the selection circuit comprises a main selection switch and a preselection switch connected in series, the main selection switch is part of the analogue's digital conversion system, and the control device is set up for controlling the preselection switch and is configured to set the delay time depending on the occurrence of a setting operation of the preselection switch.

8. Analogue-to-digital conversion system according to claim 6, wherein the analogue-to-digital conversion system has an auxiliary delay element and the control device is configured to start the auxiliary delay element upon the occurrence of a setting operation of the preselection switch and to start a detection at the earliest with the elapsing of the auxiliary delay element if, during detection, a signal present at the preselection switch is switched to the signal input of the detection device.

9. Analogue-to-digital conversion system according to claim 7, wherein the main selection switch and the preselection switch are part of the analogue-to-digital conversion system.

10. Analogue-to-digital conversion system according to claim 6, wherein the analogue-to-digital conversion system is integrated in a semiconductor component.

11. Analogue-to-digital conversion system according to claim 10, wherein the analogue-to-digital conversion system is integrated together with a processor in a semiconductor component.

12. Analogue-to-digital conversion system comprising a detection device which has an analogue signal input, and a control device for setting up a signal path through a selection circuit comprising a plurality of selection switches for coupling to the detection device, wherein the control device is configured to determine a setting operation of a selection switch and, upon each setting operation of a selection switch, to start a delay time assigned to this selection switch and to start a detection by the detection device at the earliest with the elapsing of all the delay times which are assigned to the selection switches in the signal path.

* * * * *